(12) United States Patent
Fain et al.

(10) Patent No.: US 11,584,639 B2
(45) Date of Patent: Feb. 21, 2023

(54) METHOD FOR MANUFACTURING A PLURALITY OF RESONATORS

(71) Applicant: COMMISSARIAT A L'ENERGIE ATOMIQUE ET AUX ENERGIES ALTERNATIVES, Paris (FR)

(72) Inventors: Bruno Fain, Grenoble (FR); Caroline Coutier, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 307 days.

(21) Appl. No.: 16/891,340

(22) Filed: Jun. 3, 2020

(65) Prior Publication Data

US 2020/0385262 A1     Dec. 10, 2020

(30) Foreign Application Priority Data

Jun. 7, 2019 (FR) ..................................... 19 06057

(51) Int. Cl.
    *B81C 1/00*            (2006.01)
    *B81B 3/00*            (2006.01)

(52) U.S. Cl.
    CPC ........ *B81C 1/00158* (2013.01); *B81B 3/0018* (2013.01); *B81C 1/00531* (2013.01);
    (Continued)

(58) Field of Classification Search
    CPC ............ B81C 1/00158; B81C 1/00531; B81C 1/00539; B81C 2201/0132;
    (Continued)

(56) References Cited

U.S. PATENT DOCUMENTS

2008/0121042 A1\*   5/2008   Miller ............... H01L 21/30655
                                                    73/32 A
2013/0128702 A1   5/2013   Degertekin et al.
(Continued)

FOREIGN PATENT DOCUMENTS

EP       2 1 52 024 A1     2/2010
EP       3 424 603 A1     1/2019
(Continued)

OTHER PUBLICATIONS

French Preliminary Search Report dated Mar. 5, 2020 in French Application 19 06057 filed Jun. 7, 2019 (with English Translation of Categories of Cited Documents), 2 pages.
(Continued)

*Primary Examiner* — Yasser A Abdelaziez
(74) *Attorney, Agent, or Firm* — Oblon, McClelland, Maier & Neustadt, L.L.P.

(57) ABSTRACT

A method of manufacturing a plurality of resonators, each formed by a membrane sealing a cavity, includes forming a plurality of cavities starting from one face called the front face of a support substrate, the plurality of cavities comprising central cavities and peripheral cavities arranged around the assembly formed by the central cavities, and forming central membranes and peripheral membranes covering the central cavities and peripheral cavities, respectively, by the transfer of a coverage film on the front face of the support substrate. At least part of the peripheral membranes is removed.

20 Claims, 5 Drawing Sheets

(52) U.S. Cl.
CPC .. *B81C 1/00539* (2013.01); *B81B 2201/0271* (2013.01); *B81B 2203/0127* (2013.01); *B81B 2203/0315* (2013.01); *B81C 2201/0132* (2013.01); *B81C 2201/0133* (2013.01)

(58) Field of Classification Search
CPC ........ B81C 2201/0133; B81C 1/00214; B81C 1/00547; B81B 3/0018; B81B 2201/0271; B81B 2203/0127; B81B 2203/0315; G01N 29/2406; G01N 29/022
See application file for complete search history.

(56) References Cited

U.S. PATENT DOCUMENTS

2017/0165715 A1* 6/2017 Sudol .................. G01N 29/262
2017/0245035 A1   8/2017 Lee et al.
2021/0361260 A1* 11/2021 Miao .................. A61B 8/4494

FOREIGN PATENT DOCUMENTS

| EP | 3424603 A1 * | 1/2019 | .......... A61B 8/4444 |
| WO | WO 2010/073534 A1 | 7/2010 | |
| WO | WO-2010073534 A1 * | 7/2010 | .......... B06B 1/0292 |

OTHER PUBLICATIONS

Lee, H. J. et al., "CMUT as a Chemical Sensor for DMMP Detection," IEEE 2008, pp. 434-439.
Fanget, S. et al., "Gas sensors based on gravimetric detection—A review," Sensors and Actuators B, vol. 160, 2011, pp. 804-821.

* cited by examiner

METHOD FOR MANUFACTURING A PLURALITY OF RESONATORS

TECHNICAL FIELD

This invention relates to the field of electromechanical microsystems. Electromechanical microsystems covered by this invention may in particular include sensors for acoustic transmission and/or reception with better sensitivity than sensors known in prior art.

This invention also relates to gas sensors.

In particular, this invention relates to a collective method of manufacturing a plurality of resonators, for example resonators intended for the emission/reception of ultrasounds or intended for gas detection, and particularly for the detection of gas by gravimetric measurement.

The method according to this invention proposes to exclude some of the resonators formed so as to improve the quality factor of the detector formed by the remaining resonators.

STATE OF PRIOR ART

The arrival of micro-manufacturing techniques enabled the widespread use of Micro Electro Mechanical Systems ("MEMS").

Among these techniques, resonators formed by a membrane covering a cavity are used in many applications and particularly in sensors and especially in gas sensors making use of gravimetric measurement as described in document [1] cited at the end of the description.

These membranes capable of vibrating in a direction perpendicular to the plane formed by said membranes are characterised by their resonant frequency (also associated with the resonant frequency of the sensors).

Operation of these sensors, described in document [2] cited at the end of the description, is based on the offset of the resonant frequency of their resonator, induced for example by the adsorption of chemical species on one face of said membrane.

However, the sensitivity of such a sensor provided with a single resonator, governed by the quality factor of said resonator, is such that it is difficult if not impossible to detect infinitesimal quantities of gas.

In order to improve the sensitivity and therefore the performances of the gas sensor, it has been proposed to provide the gas sensor with a plurality of resonators arranged, for example, in matrix form.

In this respect, micro-manufacturing techniques enable collective manufacturing of several hundred or even several thousand resonators intended to detect a given gas, in parallel, within the same sensor.

However this solution, considered without other precautions, cannot provide a good solution to the problems related to the sensitivity of a sensor.

Each of documents EP 2 152 024, US 2017/245035 and EP 3 424 603 discloses a device provided with a suspended membrane, but they do not provide a solution to the problems described above.

Therefore one purpose of this invention is to disclose a method of forming a plurality of resonators that has an improved quality factor when taken collectively.

Another purpose of this invention is to disclose a method for forming a plurality of resonators in which the dispersion in resonant frequencies is lower than for sensors known in prior art.

PRESENTATION OF THE INVENTION

The purpose of this invention is achieved by a method of manufacturing a plurality of resonators, each formed by a membrane sealing a cavity, the method comprises:

a) a step to form a plurality of cavities, advantageously identical, starting from one face called the front face of a support substrate, the plurality of cavities comprise central cavities and peripheral cavities arranged around the assembly formed by the central cavities;

b) a step to form membranes, called central membranes and peripheral membranes respectively, covering central cavities and peripheral cavities respectively, by the transfer of a coverage film on the front face of the support substrate; and c) a step to remove at least part of the peripheral membranes.

According to one embodiment, step c) comprises localised etching of the coverage film, the localised etching comprises in particular wet etching or dry etching.

According to one embodiment, the cavities are arranged in matrix formation.

According to one embodiment, the cavities are in the shape of a square, a rectangle, a polygon or a disk.

According to one embodiment, all peripheral membranes are removed during step c).

According to one embodiment, the peripheral membranes comprise the membranes at the edge of the matrix formation.

According to one embodiment, the peripheral membranes form a contour of several membranes with the same width.

According to one embodiment, step c) comprises the removal of peripheral membranes covering peripheral cavities at the corners of the matrix formation.

According to one embodiment, a metallic electrode common to all central membranes is formed covering said central membranes.

According to one embodiment, step b) comprises a step b1) to bond a substrate called the donor substrate, on the front face, and a step b2) to remove a first part of the donor substrate so as to keep only a second part of said substrate forming the coverage film.

According to one embodiment, step b1) is preceded by a step to form a zone of weakness separating the first part from the second part, and at which a fracture of the substrate can occur, during execution of step b2), under the effect of a heat treatment and/or a mechanical action.

According to one embodiment, step b2) is a mechanical thinning step, particularly a mechanical thinning step by grinding followed by wet etching.

According to one embodiment, the first part and the second part are separated by a stop layer at which the wet etching of step b2) stops.

According to one embodiment, step a) includes dry or wet etching of the support substrate.

According to one embodiment, the shape of the cavities is essentially square.

According to one embodiment, the coverage film comprises a semiconducting material, advantageously silicon.

BRIEF DESCRIPTION OF THE DRAWINGS

Other characteristics and advantages will become clear in the following description of a method of manufacturing a plurality of resonators given as non-limitative examples, with reference to the appended drawings wherein.

DETAILED PRESENTATION OF PARTICULAR EMBODIMENTS

This invention relates to a method of manufacturing resonators formed by membranes covering cavities.

In particular, this invention relates to a method of manufacturing resonators that will operate in parallel in a sensor and that collectively have better sensitivity than sensors that also have a plurality of resonators, and known in prior art.

In this respect, the manufacturing method according to this invention includes the formation of a plurality of resonators, for example arranged in matrix formation, followed by removal or etching of membranes of peripheral resonators.

A resonator according to this invention comprises a membrane in suspension above a cavity. In particular, the membrane may be closed by a layer called the coverage layer formed on said cavity. A coverage layer formed on a plurality of cavities thus forms a plurality of membranes in suspension above said cavities.

FIGS. 1a-1c, 2a-2c, and 3a-3j illustrate the different steps in the method for manufacturing resonators according to this invention.

Figure 1A:
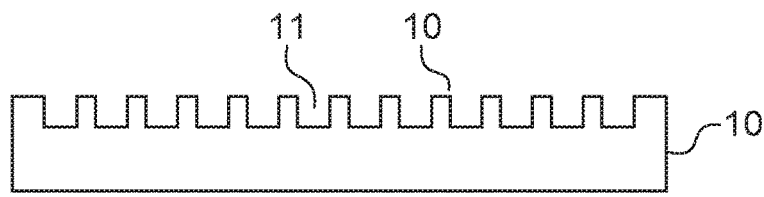
FIGS. 1a, 1b and 1c are diagrammatic representations illustrating manufacturing steps a) and b) that can be used in the framework of this invention.
Figure 1B:
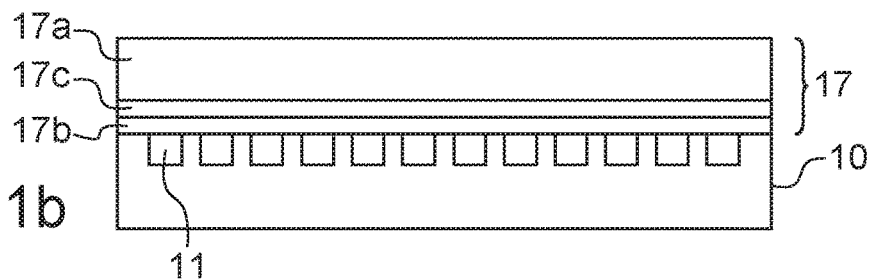
Figure 1C:
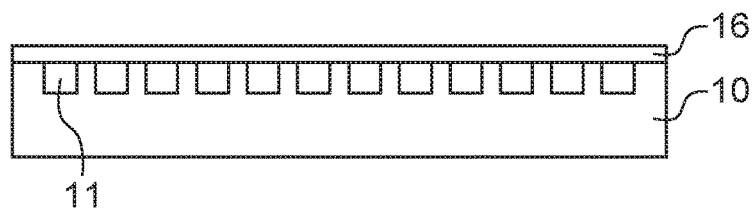
Figure 2A:
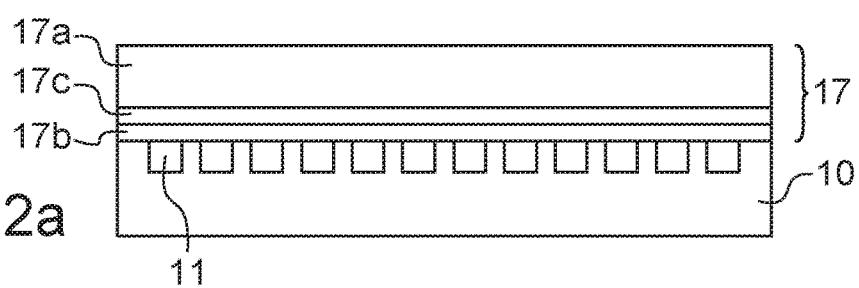
FIGS. 2a, 2b and 2c are diagrammatic representations illustrating another embodiment of manufacturing step b) that can be used in the framework of this invention.
Figure 2B:
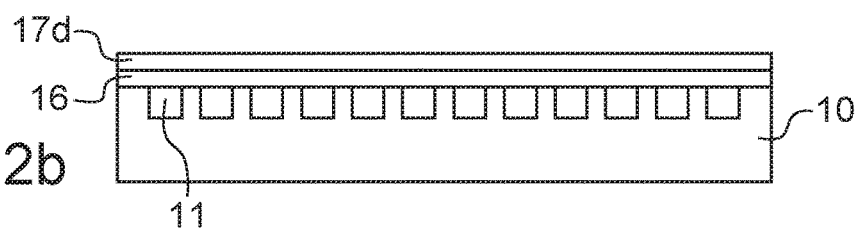
Figure 2C:
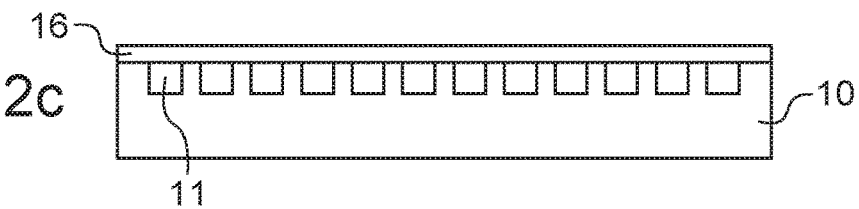

In particular, the method comprises a step a) to form a plurality of cavities 11 opening up on a front face of a support substrate 10 (FIG. 1a).

The support substrate 10 may comprise a semiconducting material, and particularly silicon.

In particular, step a) may include a masking step to delimit the contour of the cavities 11, and an etching step.

The masking step may involve the formation of a hard mask, and particularly a silicon dioxide mask.

The etching step may include dry etching (for example etching making use of a plasma) or wet etching.

Figure 3A:
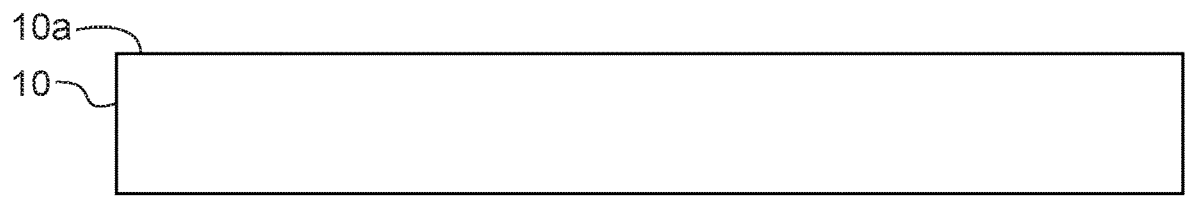
FIGS. 3a, 3b, 3c, 3d, 3e, 3f, 3g, 3h, 3i and 3j are diagrammatic representations of a set of manufacturing steps making use of the method according to this invention, and that can lead to manufacturing of a sensor.
Figure 3B:
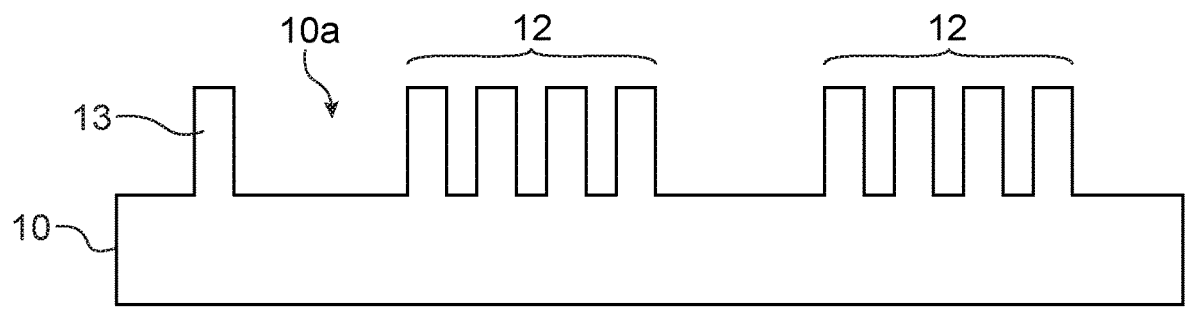

As a non-limitative example, step a) may comprise the following steps:

a1) a step to supply a support substrate 10, particularly a silicon substrate (FIG. 3a); and a2) a step to form first patterns 12 in projection from a front face 10a of the support substrate, the first patterns 12 and the second patterns 13, in particular defining square- or rectangular-shaped columns on which cavities 11 and contacts 14a respectively will be formed (FIG. 3b).

This step a2) may include a photolithography step and an etching step, in order. The first patterns 12 and the second patterns 13 may for example have a height of between 500 nm and 2 μm.

Figure 3C:
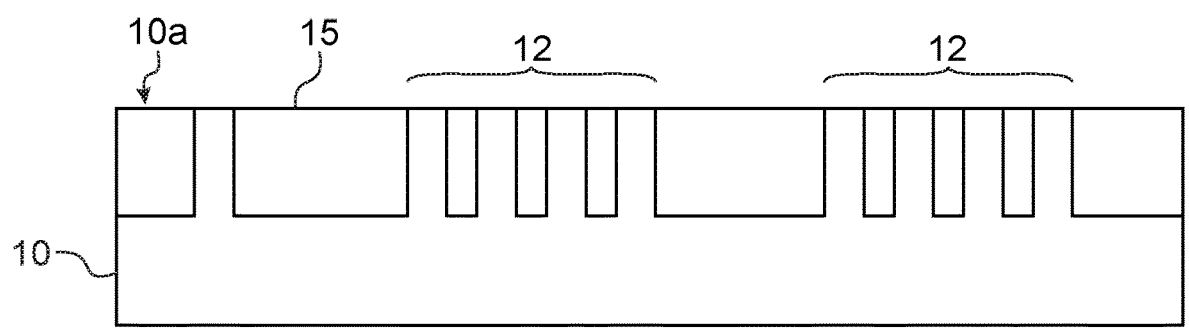

Still according to this example, step a) may also include a step a3) in which the volume between the first patterns 12 and the second patterns 13 is filled with a dielectric material 15 (FIG. 3c). In particular, the dielectric material 15 may include silicon oxide deposited by a PECVD (Plasma Enhanced Chemical Vapour Deposition) chemical deposition technique.

It is understood that filling takes place so as to let exposed expose peaks of the first patterns 12 and second patterns 13 to the external atmosphere. In other words, all excess dielectric material 14, for example deposited on the peaks of the first patterns 12 and the second patterns 13, can be removed using a polishing process, and particularly mechanochemical polishing.

Figure 3D:
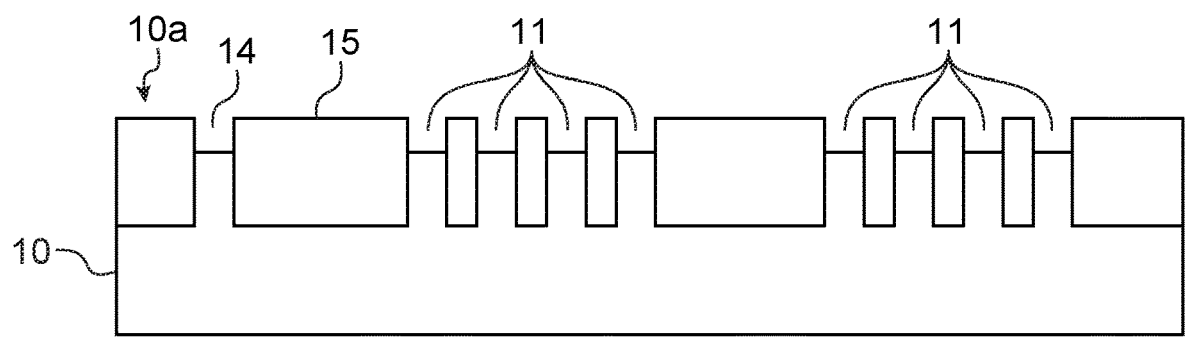

Step a3) can be followed by a step a4) to partially etch the first patterns 12 and the second patterns 13 so as to form the cavities 11 and contact zones 14 respectively (FIG. 3d).

The depth of the cavities 11 (and the contact zones 14) thus formed can be between 50 nm and 1000 nm.

As specified above, the shape of the cavities 11 is defined by the shape of the first patterns 12.

The micro-manufacturing techniques (or technological steps) mentioned above make it possible to consider collectively forming a very large number of cavities, and particularly several hundred or even several thousand identical cavities.

Figure 4:
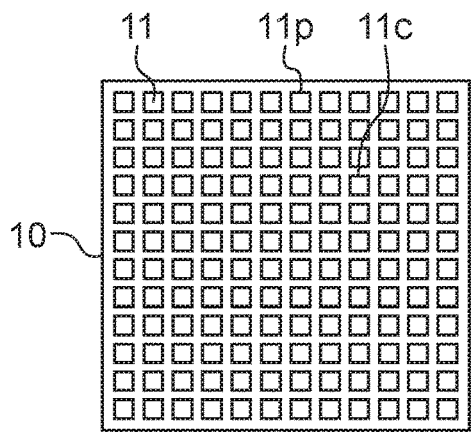
FIG. 4 represents a matrix arrangement of cavities.

Thus, and non-limitatively, the cavities 11 can be arranged in a matrix arrangement FIG. 4).

"Matrix arrangement" means a periodic and regular arrangement of the cavities 11 along two orthogonal directions. The matrix arrangement comprises particularly n rows and m columns of cavities 11.

The remainder of the description of this invention will be limited to a matrix arrangement of cavities, for simplification reasons. However, an expert in the subject will be able to generalise the invention to other arrangements.

The method according to this invention also comprises a step b) to form membranes.

In particular, the step b) to form membranes 19 comprises the transfer of a coverage layer 16 onto the front face of the support substrate 10.

The membranes 19 are in suspension above the cavities 11.

In particular, the transfer of the coverage film may include a step b1) to bond a substrate called the donor substrate 17, on the front face 11a, and a step b2) to remove a first part 17a of the donor substrate 17 so as to keep only a second part 17b of said substrate forming the coverage film 16 (FIGS. 1b, 1c, 2a, 2b, 2c, 3f and 3g).

It is understood that the bonding step b1) may include molecular bonding (or direct bonding), thermocompression bonding.

However, the invention must not be limited to these two types of bonding and in particular may including bonding involving an intermediate bonding layer (for example a polymer material), anode bonding, eutectic bonding.

The bonding step b1) may be executed under a vacuum or under a controlled atmosphere, particularly to impose a predetermined gas and pressure in the cavities 11 sealed by the coverage film 16.

Furthermore, it is understood, without the need to state it, that the cavities are hermetically sealed by the coverage film.

"Hermetic sealing" means sealing that prevents gas exchanges between the cavities considered and the external environment.

Step b1) may be preceded by a step to form a zone of weakness 17c separating the first part 17a from the second part 17b, and at which a fracture of the donor substrate 17 can occur, during execution of step b2), under the effect of a heat treatment and/or a mechanical action.

The zone of weakness 17c may be an amorphised zone or an implanted zone, particularly a zone implanted with hydrogen atoms.

Alternatively and in the absence of a zone of weakness 17c, step b2) may include a mechanical thinning step (FIGS. 2a to 2c), and particularly a mechanical thinning step by grinding may be complemented by chemical etching.

Also according to this alternative, the first part 17a and the second part 17b are separated by a stop layer 17d at which the chemical etching of step b2) stops. In other words, the chemical etching is selective etching, and preferentially etches the first part 17a facing the stop layer 17d.

According to this alternative, the donor substrate 17 may in particular be a silicon on insulator ("SOI") substrate, the insulation layer being the stop layer. The silicon layer of the SOI substrate is advantageously strongly doped. The stop layer may be etched by grinding or by a selective chemical etching step.

Figure 3E:
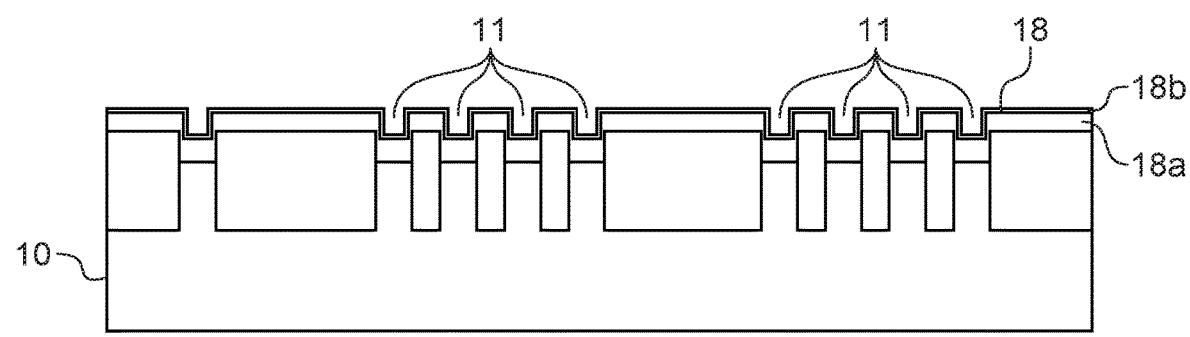
Figure 3F:
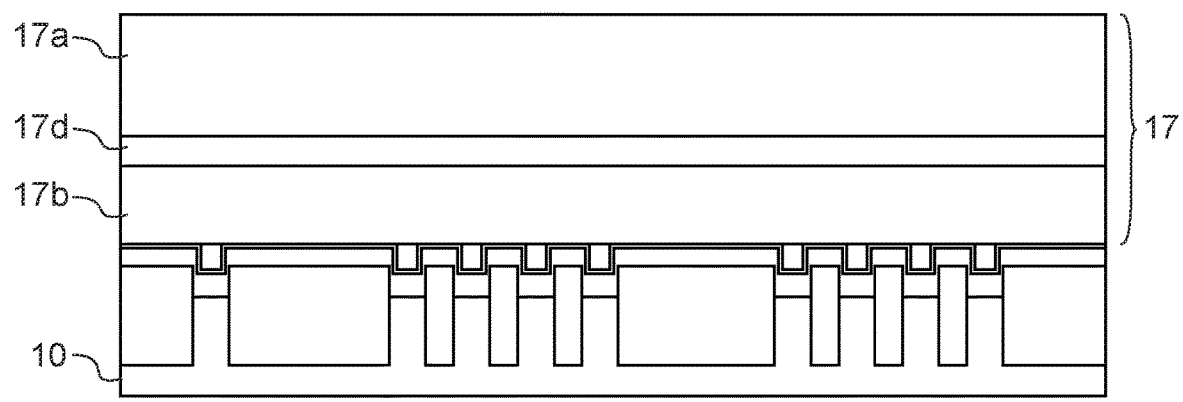
Figure 3G:
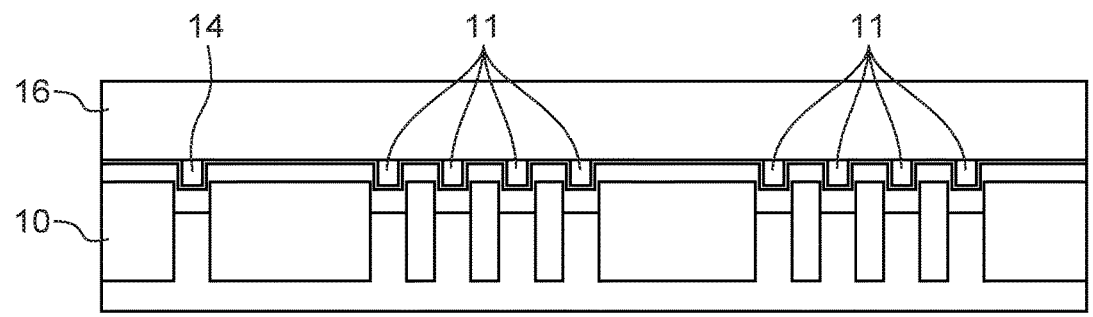

Step b) may be preceded by a step to deposit a passivation layer covering the front face 10a (FIG. 3e). In particular, the passivation layer 18 may include a first deposit of a silicon nitride layer 18a by following a second deposit of a silicon dioxide layer 18b.

The thickness of each of these two layers 18a and 18b may be between 30 nm and 300 nm.

The first layer 18a may be formed by "Low Pressure Chemical Vapour Deposition" (LPCVD).

The second layer 18b may be formed by plasma assisted chemical vapour deposition.

Figure 3H:
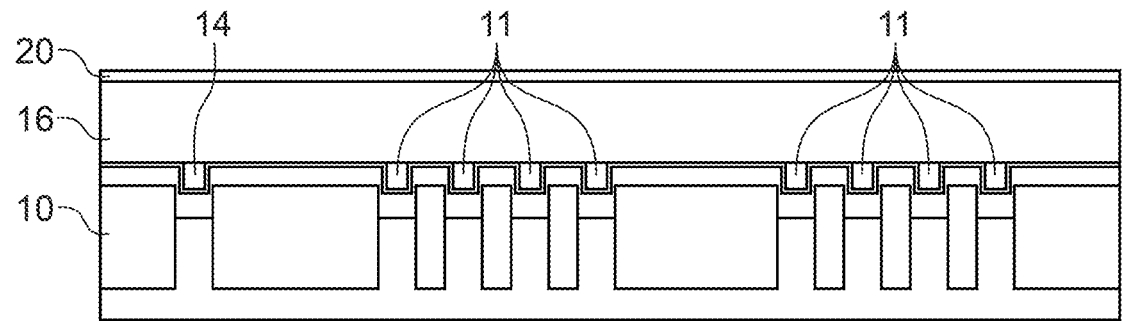

Step b) may also be followed by a step to deposit a passivation layer 20 on the coverage film (FIG. 3h). The passivation layer 20 may include a 50 nm thick silicon nitride layer formed by LPCVD.

According to this invention, a distinction is made between firstly the central resonators formed by central cavities 11c and central membranes 19c, and secondly peripheral resonators formed by peripheral cavities 11p and peripheral membranes 19p.

The peripheral resonators are arranged around the assembly composed of the central resonators.

"Arranged around" means forming a closed path around the central resonators.

Figure 5A:
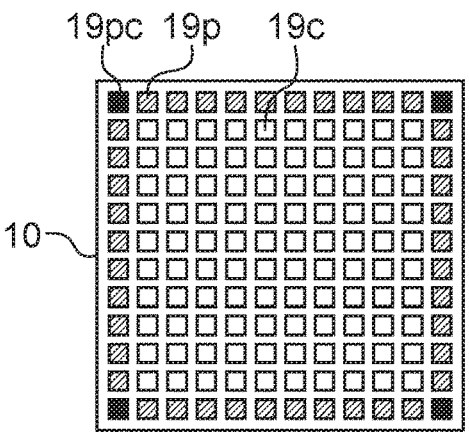
FIGS. 5a, 5b, 5c and 5d are representations of different variants of this invention, the white membranes are membranes that are kept, the black membranes are etched membranes and the cross-hatched membranes are unetched peripheral membranes.
Figure 5B:
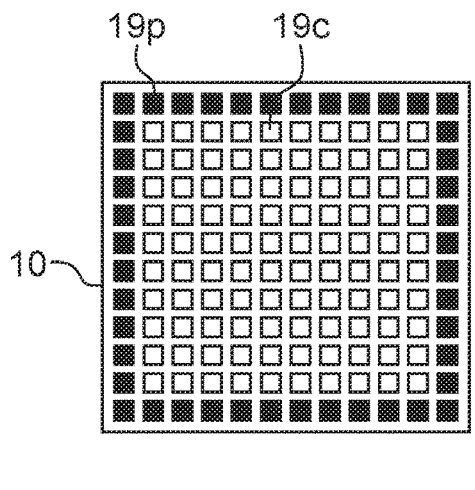

According to a first aspect of this invention, the peripheral membranes 19p may include the membranes at the edge of the matrix arrangement (FIG. 5b).

Figure 5C:
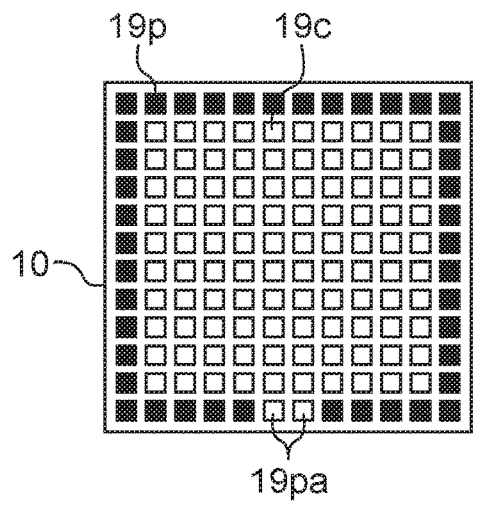
Figure 5D:
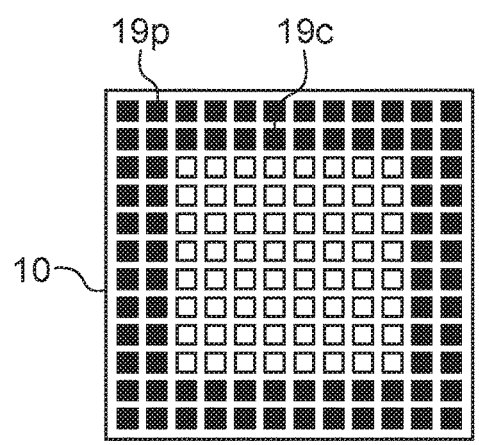

According to a second aspect, the peripheral membranes 19p form a contour with a width of several membranes (FIG. 5d).

Thus according to this invention, the peripheral membranes are at least partly removed during a removal step c) executed after step b).

Step c) may include localised etching of the coverage film, the localised etching includes in particular wet etching or dry etching.

According to a first variant (illustrated in FIG. 5a), only the peripheral membranes 19p (denoted 19pc on FIG. 5a) covering the peripheral cavities 11p at the corners of the matrix arrangement are removed.

According to a second variant (illustrated on FIG. 5b), all peripheral membranes 19p are removed during step c). According to this variant, it may be decided to keep at least two adjacent peripheral membranes denoted 19pa (FIG. 5c).

Figure 3I:
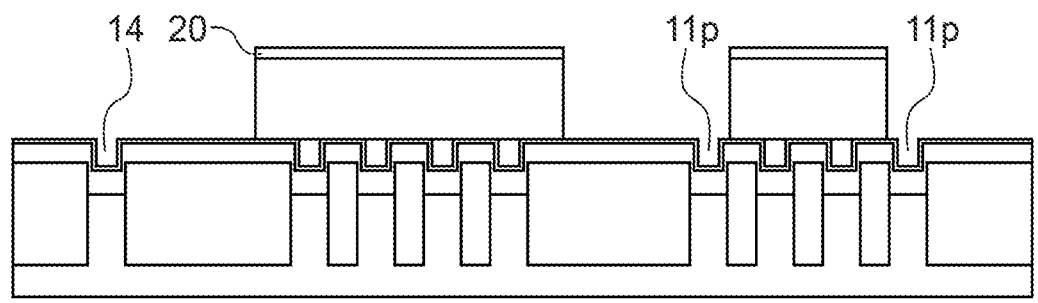
Figure 3J:
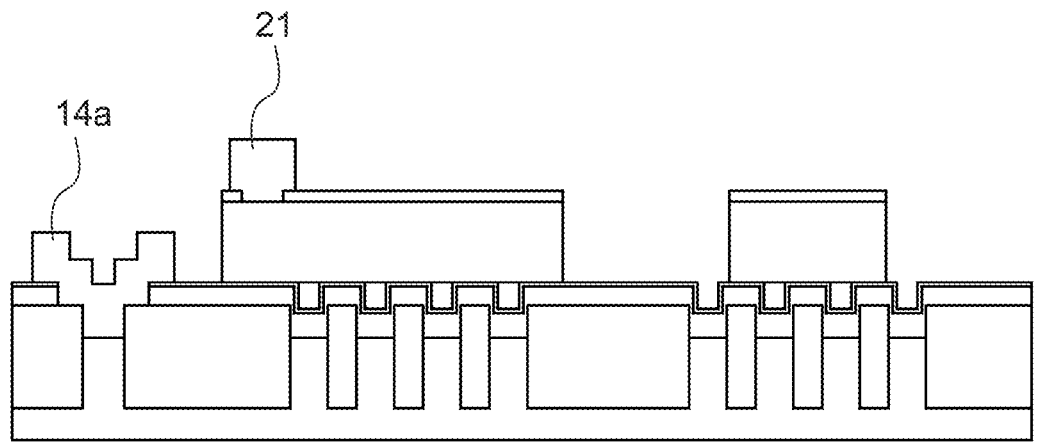

Step c) to remove the peripheral membranes is also illustrated on FIG. 3i. In particular, this removal can take place during a localised etching step of the passivation layer 20, and the coverage film 16 that will provide access to the contact zones 14.

Finally, a step to make contact can be executed (FIG. 3j) at the contact zone 14 and at the central membranes.

In particular, this step may involve the formation of openings in the passivation layers 18 and 20, and the formation of contacts 14a and 21, particularly by depositing silicon aluminide by physical vapour phase deposition.

The contacts 14a may contact all or some of the membranes 19. All of the membranes 19 may be provided with one or several groups of membranes 19, the contacts 14a of the membranes 19 of a given group forming a common electrode.

As soon as they form a common electrode, the contacts 14a may be arranged along lines, spirals. However, the invention is not limited to these configurations.

The method of manufacturing a plurality of resonators according to this invention, and particularly the removal of at least some of the peripheral membranes, can increase the quality factor of the resonator.

Without being restricted by the following reasoning, the inventors believe that the immediate environment of the membranes can have an influence on stresses applied to the membranes.

In particular, the inventors believe that the pressure in the cavities is not the same in each cavity, particular during execution of the bonding step, and consequently induces a deflection of membranes from one resonator to another. In particular, this difference is more marked between central cavities and peripheral cavities.

In other words, the peripheral membranes as defined in this invention, and more particularly those closest to the edge of the plurality of membranes, are subjected to constraints (for example due to the internal pressure in the cavity) that are very different to those applied to the central membranes.

The central resonators form an assembly with more homogeneous applied stresses and consequently that collectively have a higher quality factor than the quality factor for the same assembly but for which all central and peripheral membranes are kept.

The improvement to the quality factor then makes it possible to consider manufacturing gas sensors using gravimetric measurement with better sensitivity.

In particular, such sensors can be used as smell sensors or for mass spectrometry.

In particular, the sensor may include a capacitive micromachined ultrasound transducer (cMUT).

REFERENCES

[1] Hyunjoo J. Lee et al., «CMUT as a Chemical Sensor for DMMP Detection», IEEE, 2008, pages 434-439.
[2] S. Fanget et al., «Gas sensors based on gravimetric detection—A review», Sensors and Actuators B, 160, 804-821, 2011.

The invention claimed is:
1. A method of manufacturing a plurality of resonators, each formed by a membrane sealing a cavity, comprising:
  a) forming a plurality of cavities starting from a front face of a support substrate, the plurality of cavities comprising central cavities and peripheral cavities arranged around an assembly formed by the central cavities;
  b) forming central membranes and peripheral membranes covering central cavities and peripheral cavities, respectively, by transfer of a coverage film on the front face of the support substrate; and c) removing at least part of the peripheral membranes such that a quality factor of the plurality of resonators whose membranes are not removed is increased.

2. The method according to claim 1), wherein step c) comprises localised etching of the coverage film, the localised etching comprising one of wet etching and dry etching.

3. The method according to claim 1, comprising arranging the cavities in matrix formation.

4. A method of manufacturing a plurality of resonators, each formed by a membrane sealing a cavity, comprising:
a) firming a plurality of cavities starting from a front face of a support substrate, the plurality of cavities comprising central cavities and peripheral cavities arranged around an assembly formed by the central cavities;
b) forming central membranes and peripheral membranes covering central cavities and peripheral cavities, respectively, by transfer of a coverage film on the front face of the support substrate; and
c) removing all of the peripheral membranes.

5. The method according to claim 3, wherein the peripheral membranes include the membranes at an edge of the matrix formation.

6. The method according to claim 3, wherein the peripheral membranes form a contour with a width of several membranes.

7. The method according to claim 3, wherein step c) comprises removing peripheral membranes covering peripheral cavities at corners of the matrix formation.

8. The method according to claim 1, comprising forming a metallic electrode common to all central membranes covering said central membranes.

9. The method according to claim 1, wherein step b) comprises a step b1) of bonding a donor substrate, on the front face, and a step b2) of removing a first part of the donor substrate so as to keep only a second part of said substrate forming the coverage film.

10. The method according to claim 9, wherein step b1) is preceded by forming a zone of weakness separating the first part from the second part, and at which a fracture of the substrate can occur, during execution of step b2), under an effect of a heat treatment and/or a mechanical action.

11. The method according to claim 9, wherein step b2) is a mechanical thinning step.

12. The method according to claim 9, where the first part and the second part are separated by an etch stop layer at which the wet etching of step b2) stops.

13. The method according to claim 1, wherein step a) comprises dry or wet etching of the support substrate.

14. The method according to claim 1, wherein the shape of the cavities is essentially square.

15. The method according to claim 1, wherein the coverage film comprises a semiconducting material.

16. The method according to claim 1, wherein the coverage film comprises silicon.

17. The method according to claim 11, wherein the mechanical thinning step comprises grinding followed by wet etching.

18. The method according to claim 1, comprising forming the plurality of cavities to be identical.

19. The method according to claim 1, wherein
forming the plurality of cavities comprises forming the central cavities and the peripheral cavities in a matrix, where the peripheral cavities are arranged in each outermost side of the matrix; and
removing at least part of the peripheral membranes comprises removing a plurality of peripheral membranes in each outermost side.

20. A method of manufacturing a plurality of resonators, each formed by a membrane sealing a cavity, comprising:
a) forming a plurality of cavities in a front face of a support substrate, the plurality of cavities comprising central cavities and peripheral cavities arranged around an assembly formed by the central cavities;
b) forming central membranes and peripheral membranes covering central cavities and peripheral cavities, respectively, by transfer of a coverage film on the front face of the support substrate; and
c) removing ones of the peripheral membranes having a difference in deflection one to another that is greater than a difference in deflection of the central membranes one to another.

* * * * *